US009934825B2

(12) United States Patent
Matsumoto et al.

(10) Patent No.: US 9,934,825 B2
(45) Date of Patent: Apr. 3, 2018

(54) SEMICONDUCTOR DEVICE AND ELECTRONIC DEVICE

(71) Applicant: Toshiba Memory Corporation, Minato-ku (JP)

(72) Inventors: Manabu Matsumoto, Yokohama (JP); Katsuya Murakami, Sumida (JP); Koichi Nagai, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/643,339

(22) Filed: Mar. 10, 2015

(65) Prior Publication Data

US 2016/0172016 A1 Jun. 16, 2016

Related U.S. Application Data

(60) Provisional application No. 62/091,242, filed on Dec. 12, 2014.

(51) Int. Cl.

| | |
|---|---|
| ***G11C 7/00*** | (2006.01) |
| ***G11C 5/04*** | (2006.01) |
| ***G06F 11/10*** | (2006.01) |

(52) U.S. Cl.
CPC ............ *G11C 5/04* (2013.01); *G06F 11/1076* (2013.01)

(58) Field of Classification Search
CPC ....... G11C 7/22; G11C 7/1078; G11C 7/1072; G11C 7/1051
See application file for complete search history.

(56) References Cited

U.S. PATENT DOCUMENTS

| | | | | |
|---|---|---|---|---|
| 2004/0221111 | A1* | 11/2004 | Phelps et al. | 711/137 |
| 2008/0034149 | A1* | 2/2008 | Sheen | G06F 13/1668 711/100 |
| 2008/0080261 | A1* | 4/2008 | Shaeffer et al. | 365/189.05 |
| 2010/0049914 | A1 | 2/2010 | Goodwin | |
| 2010/0073860 | A1 | 3/2010 | Moriai et al. | |
| 2010/0161883 | A1 | 6/2010 | Kurashige | |
| 2011/0066837 | A1* | 3/2011 | Lee | G06F 9/4401 713/2 |
| 2011/0283043 | A1 | 11/2011 | Schuette | |
| 2013/0219235 | A1 | 8/2013 | Ohba et al. | |

FOREIGN PATENT DOCUMENTS

| | | |
|---|---|---|
| JP | 2010-79445 | 4/2010 |
| JP | 2010-152551 | 7/2010 |
| JP | 2013-171337 | 9/2013 |

* cited by examiner

*Primary Examiner* — Richard Elms
*Assistant Examiner* — Mohammed A Bashar
(74) *Attorney, Agent, or Firm* — Oblon, McClelland, Maier & Neustadt, L.L.P.

(57) ABSTRACT

According to one embodiment, a semiconductor device includes, for example, a circuit board, a plurality of elements, a plurality of controllers, and a first signal line. The elements are provided on the circuit board. The elements each include a memory. The controllers each are configured to control read of data from the memory. The controllers each are configured to control write of data into the memory. A control signal is transmitted through the first signal line. The first signal line is used in common by the controllers.

20 Claims, 8 Drawing Sheets

| TYPE | CONFIG-0 | CONFIG-1 |
|---|---|---|
| (a) | NC | NC |
| (b) | GND | NC |
| (c) | NC | GND |
| (d) | GND | GND |

SEMICONDUCTOR DEVICE AND ELECTRONIC DEVICE

CROSS-REFERENCE TO RELATED APPLICATIONS

This application is based upon and claims the benefit of priority from U.S. Provisional Application No. 62/091,242, filed on Dec. 12, 2014; the entire contents of which are incorporated herein by reference.

FIELD

Embodiments described herein relate generally to a semiconductor device and electronic device.

BACKGROUND

Conventionally, there has been known a semiconductor device, in which a plurality of memory elements and a single controller for controlling read and write of data of the plurality of memory elements are mounted on a board.

For a semiconductor device of this kind, it is worthwhile to obtain a new configuration that entails fewer problems.

DETAILED DESCRIPTION

Figure 1:
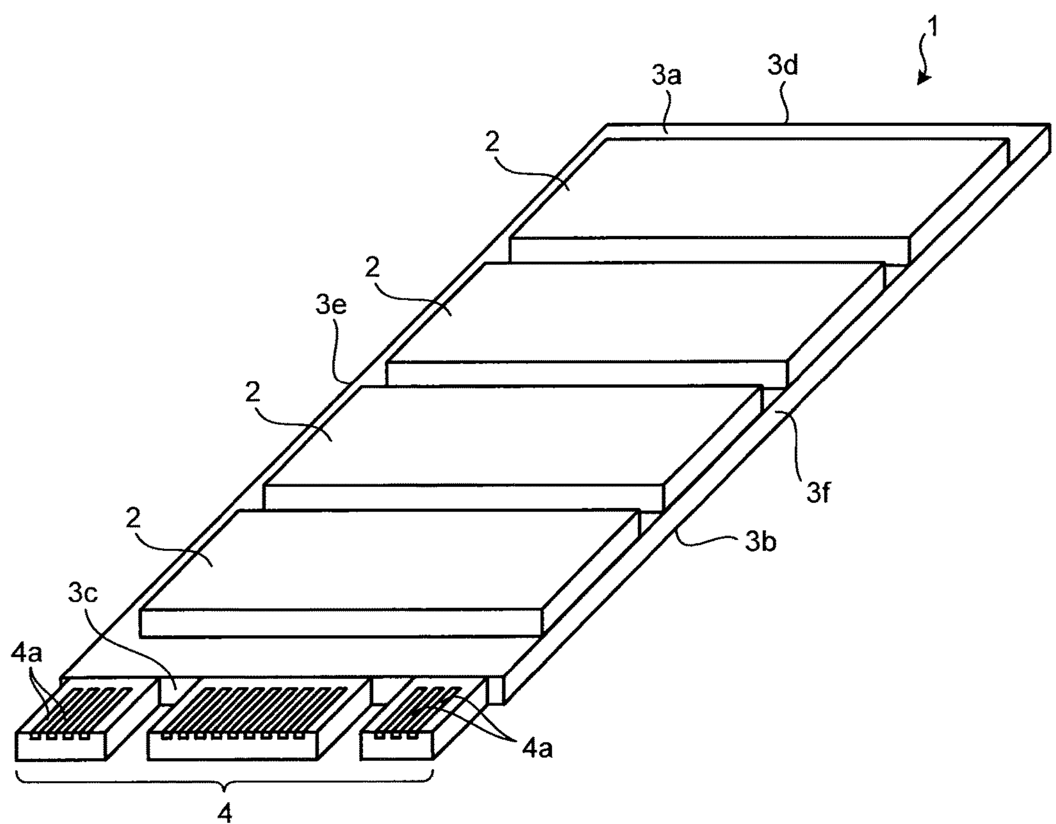
FIG. 1 is an exemplary and schematic perspective view showing a semiconductor device according to an embodiment.

In general, according to one embodiment, a semiconductor device includes, for example, a circuit board, a plurality of elements, a plurality of controllers, and a first signal line. The elements are provided on the circuit board. The elements each include a memory. The controllers each are configured to control read of data from the memory. The controllers each are configured to control write of data into the memory. A control signal is transmitted through the first signal line. The first signal line is used in common by the controllers.

Exemplary embodiments of a semiconductor device and an electronic device will be disclosed. In the embodiments described below, the configuration and control (technical features) and the functions and results (effects) obtained by the configuration and control are mere examples. Further, a plurality of embodiments and a modification exemplified below include the same constituent elements. The same constituent elements are denoted by the common reference numerals, and their repetitive description will be suitably omitted.

As exemplified in FIG. 1, a semiconductor device 1 according to an embodiment is a so-called SSD (solid state drive) that includes a plurality of memory elements 2 (packages or storage components). This semiconductor device 1 may also be referred to as an SSD module, silicon drive, or flash drive. Further, in this embodiment, the semiconductor device 1 does not include a casing by itself, but is used in a state contained in a host device (electronic device), such as a personal computer, including a casing. The semiconductor device 1 can be used in place of an HDD (hard disk drive).

As shown in FIG. 1, the semiconductor device 1 includes a plurality of memory elements 2, a single circuit board 3, and a single connector 4. In this embodiment, the semiconductor device 1 includes four memory elements 2 as an example.

For example, the circuit board 3 (board) may be formed as a rigid printed wiring board, such as a multilayer board, build-up board, or coreless board. The circuit board 3 includes insulating portions and conductive portions. The insulating portions may be made of a synthetic resin material or ceramic, which has an insulating property. Further, the conductive portions include conductive patterns (wiring patterns), conductive layers, wires, through-holes, vias, and/or penetration electrodes. The circuit board 3 is formed in a rectangular shape (quadrilateral shape) and in a plate state, and includes ends 3*c* and 3*d* on the opposite sides in the longitudinal direction, and ends 3*e* and 3*f* on the opposite sides in the lateral direction (width direction). Each of the ends 3*c* to 3*f* may also be referred to as an edge portion or side portion.

Further, the circuit board 3 includes a face 3*a* and a face 3*b* opposite to each other. In this embodiment, all of the plurality of memory elements 2 are disposed on the face 3*a* and they are not disposed on the face 3*b*. Similarly, the electronic components (not shown) and the elements other than the memory elements 2 are mounted on the face 3*a* and they are not disposed on the face 3*b*. Accordingly, the face 3*a* may be referred to as a component mounting face, and the face 3*b* may be referred to as a component non-mounting face. On the face 3*a*, the plurality of memory elements 2 are arrayed at intervals in the longitudinal direction of the circuit board 3, and are aligned in this longitudinal direction. However, the alignment of the plurality of memory elements 2 is not essential.

The connector 4 (interface unit) extends along the end 3*c* of the circuit board 3. The connector 4 includes a plurality of terminals 4*a*. The plurality of terminals 4*a* are set in parallel with each other and are arrayed at intervals along the end 3*c*, i.e., in the direction in which the end 3*c* extends. Each of the terminals 4*a* extends like a strip in a direction (the crossing direction or the longitudinal direction of the circuit board 3) perpendicular to the direction in which the end 3*c* extends. The connector 4 is an example of a first connector.

The connector 4 can transmit a signal between a device (not shown) outside the semiconductor device 1 and the memory elements 2. Here, the connector 4 may conform to the PCI Express (PCIe) standard, for example. In this case, high-speed differential signals (high-speed signals) are transmitted between the device outside the semiconductor device 1 and the memory elements 2 through the connector 4. In the following description, the device outside the semiconductor device 1, which accesses data of the memory elements 2 of the semiconductor device 1, will be simply referred to as a host device.

Figure 2:
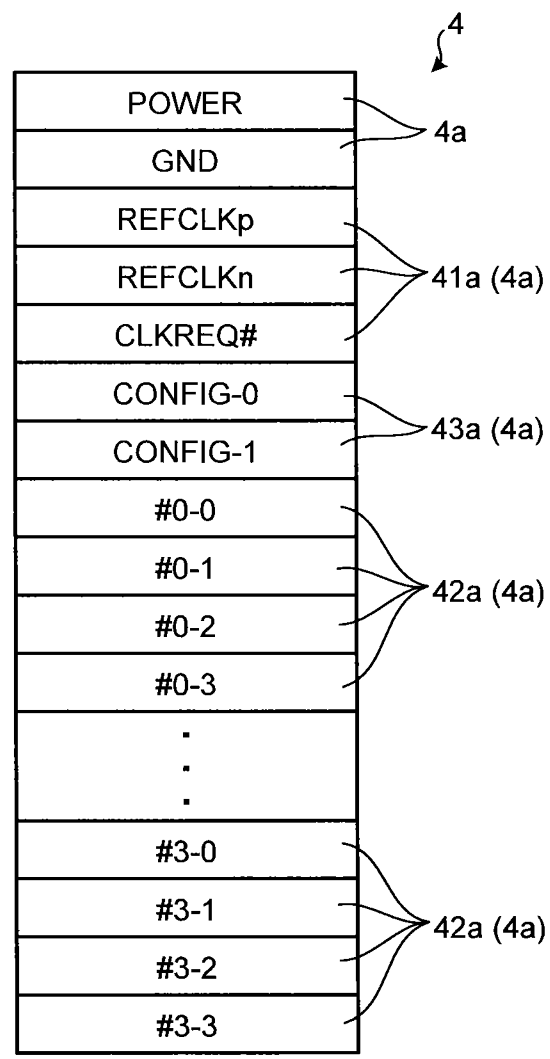
FIG. 2 is a view showing an example of an arrangement of terminals of a connector included in the semiconductor device according to the embodiment.

FIG. 2 shows an example of an arrangement of the terminals 4*a* (pins) of the connector 4. A plurality of blocks included in FIG. 2 respectively correspond to terminals 4*a*. Here, "POWER" is a power terminal, "GND" is a ground terminal, "REFCLKp" and "REFCLKn" are terminals for reference clock signals (clock signals or control signals), which are clock signals of a reference frequency, "CLKREQ#" is a terminal for a clock request signal (request signal or control signal) for requesting the clock signals, "CONFIG-0" and "CONFIG-1" are terminals for discriminating the configuration of the semiconductor device 1, and "#0-0" to "#3-3" are terminals for high-speed differential signals (data signals). The terminals 41*a* of "REFCLKp", "REFCLKn", and "CLKREQ#" are examples of a first terminal (control signal terminal), the terminals 42*a* of "#0-0" to "#3-3" are examples of a second terminal (data signal terminal), and the terminals 43*a* of "CONFIG-0" and "CONFIG-1" are examples of a third terminal (configuration discrimination terminal or discrimination terminal). FIG. 2 merely shows schematic examples of the plurality of terminals 4*a*, and so the number, arrangement, and/or order of the terminals 4*a* are not limited to those shown in FIG. 2.

Figures 3, 4:
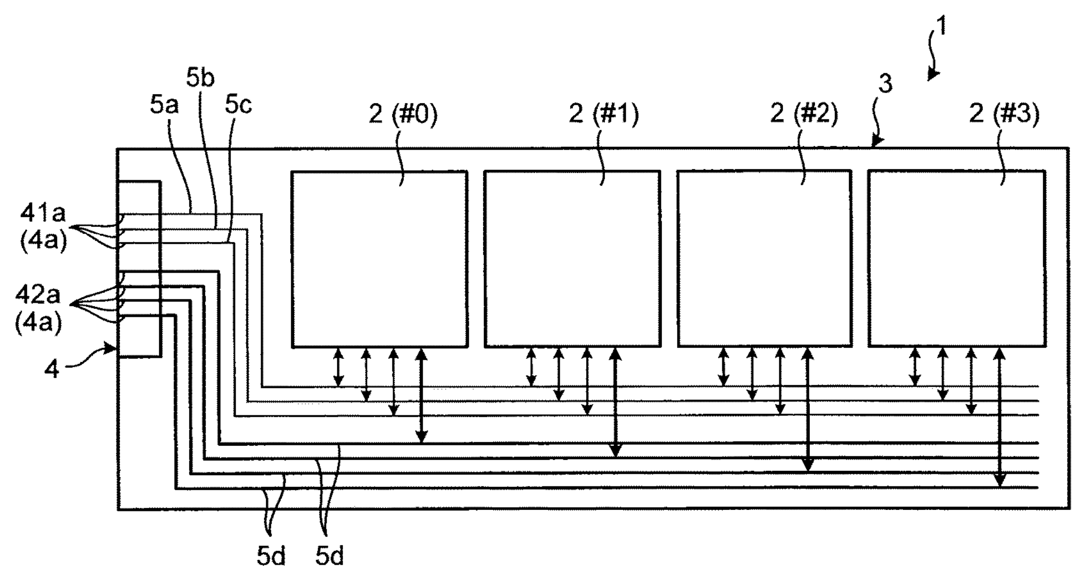
FIG. 3 is an exemplary and schematic block diagram showing the semiconductor device according to the embodiment.
FIG. 4 is a table showing examples of a combination of the electric statuses of a plurality of terminals for discriminating a plurality of types of the configuration of the semiconductor device according to the embodiment.

FIG. 3 shows an example of a schematic configuration of an electric circuit where the connector 4 and the memory elements 2 are connected to each other by buses 5*a* to 5*d* (lines or signal lines) in the semiconductor device 1. The buses 5*a* to 5*d* are formed of conductive portions of the circuit board 3. The bus 5*a* electrically connects the terminal 41*a* of "REFCLKp" of the connector 4 to the plurality of memory elements 2. The bus 5*b* electrically connects the terminal 41*a* of "REFCLKn" of the connector 4 and the plurality of memory elements 2. The bus 5*c* electrically connects the terminal 41*a* of "CLKREQ#" of the connector 4 and the plurality of memory elements 2. In other words, the terminals 41*a* of "REFCLKp", "REFCLKn", and "CLKREQ#" and the buses 5*a* to 5*c* respectively corresponding to these terminals 41*a* are used in common by the plurality of memory elements 2. Further, the buses 5*d* electrically connect the terminals 42*a* of "#0-0" to "#3-3" and respective ones of the memory elements 2 corresponding to these terminals 42*a*. In other words, the terminals 42*a* of "#0-0" to "#3-3" and the buses 5*d* corresponding to these terminals 42*a* are connected to respective ones of the memory elements 2, and they are not used in common by the plurality of memory elements 2. In this embodiment, the terminals 41*a* and the buses 5*a* to 5*c* for the reference clock signals and clock request signal serving as control signals are used in common by the plurality of memory elements 2. Accordingly, the arrangement of the terminals 4*a* of the connector 4 according to this embodiment can be set almost the same as the arrangement of terminals of a connector used in a conventional semiconductor device (not shown) configured such that a single controller controls read and write of four memory elements 2. Here, the buses 5*a* to 5*c* are examples of a first signal line (control signal line), and the buses 5*d* are examples of a second signal line (data signal line). Further, FIG. 3 shows each one of the buses 5*d* by use of a single line, but each one is actually formed of four lines for a single memory element 2. The set of four buses 5*d* may also be referred to as a single lane.

Further, FIG. 4 shows examples of a plurality of types of the semiconductor device 1. Each of the configurations (types (a) to (d)) of the semiconductor device 1 shown in FIG. 4 includes a connector of the same form as the connector 4 of the semiconductor device 1 according to this embodiment. Specifically, in FIG. 4, the following four types (a) to (d) are set.

(a) The semiconductor device 1 includes a plurality of (four at most) memories and a single controller, and the controller is configured to control all the memories and it uses a plurality of (four at most) lanes.

(b) The semiconductor device 1 includes four memories and two controllers, and each controller is configured to control two memories and it uses two lanes.

(c) The semiconductor device 1 includes three memories and three controllers, and each controller is configured to control one memory and it uses one lane.

(d) The semiconductor device 1 includes four memories and four controllers, and each controller is configured to control one memory and it uses one lane.

Each memory mentioned here is contained in a memory element 2, and is formed of a collective body of a plurality of memory chips. Here, without being limited to the embodiment in this respect, each of the types described above may be configured such that each controller may be contained in a memory element 2 or provided independently of the memory elements 2.

Further, in this embodiment, in order to allow the host device to discriminate the configuration types of the semiconductor device 1, each of the two terminals 43*a* of "CONFIG-0" and "CONFIG-1" of the connector 4 according to this embodiment (see FIG. 2) is set to have two electric statuses (levels or values). For example, one of the two electric statuses is a non-connection state (NC) where it is electrically isolated from any conductive portion of the ground potential and from any conductive portion of the power supply potential, and the other status is a state (GND) where it is connected to the ground. In the non-connection state, the impedance of each terminal 43*a* is infinite, and the potential of each terminal 43*a* takes a value different from the ground potential and the power supply potential. On the other hand, in the state connected to the ground, the impedance of each terminal 43*a* takes a value of, e.g., approximately 0, and the potential of each terminal 43*a* is the ground potential. Accordingly, by use of the setting described above, an impedance status and a potential status are set in each terminal 43*a*.

The host device can detect the electric statuses (such as impedance and potential) of the terminals 4*a* of "CONFIG-0" and "CONFIG-1" and discriminate the configuration (type) of the semiconductor device 1 in accordance with the prescription concerning combinations of detected statuses. In other words, the host device can perform read and/or write of data in accordance with this type. In the case of the prescription exemplified in FIG. 4, the host device can discriminate the types, as follows: When the terminal 43*a* of "CONFIG-0" is in "NC" and the terminal 43*a* of "CONFIG- 1" is in "NC", it is discriminated as the type (a) described above. Further, when the terminal 43*a* of "CONFIG-0" is in "GND" and the terminal 43*a* of "CONFIG-1" is in "NC", it is discriminated as the type (b) described above. Further, when the terminal 43*a* of "CONFIG-0" is in "NC" and the terminal 43*a* of "CONFIG-1" is in "GND", it is discriminated as the type (c) described above. Further, when the terminal 43*a* of "CONFIG-0" is in "GND" and the terminal 43*a* of "CONFIG-1" is in "GND", it is discriminated as the type (d) described above. The allocation of combinations of the statuses to the respective types is not limited to the examples shown in FIG. 4, but can be set in various manners. Further, if the semiconductor device 1 includes four or more memory elements 2, and the number of preset configuration types is thereby larger, three or more terminals 43*a* may be set such that each of them can take two electric statuses. Further, three or more electric statuses may be set in each of the terminals 43*a* for discrimination.

Figure 5:
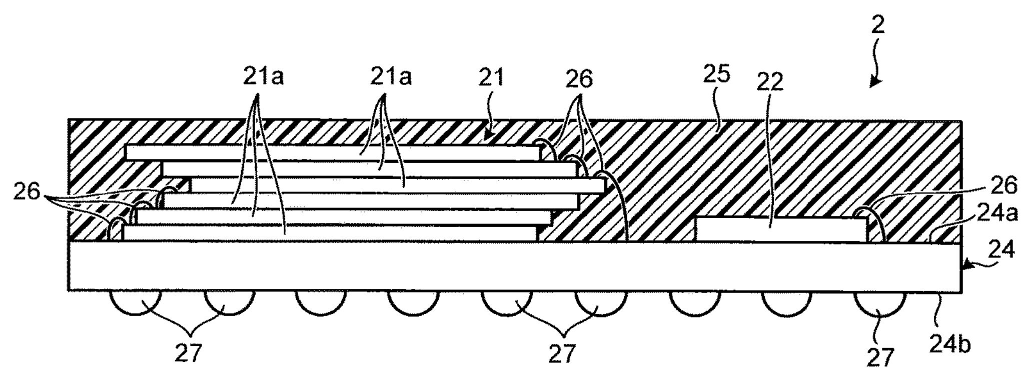
FIG. 5 is an exemplary and schematic sectional view showing a memory element included in the semiconductor device according to the embodiment.
Figure 6:
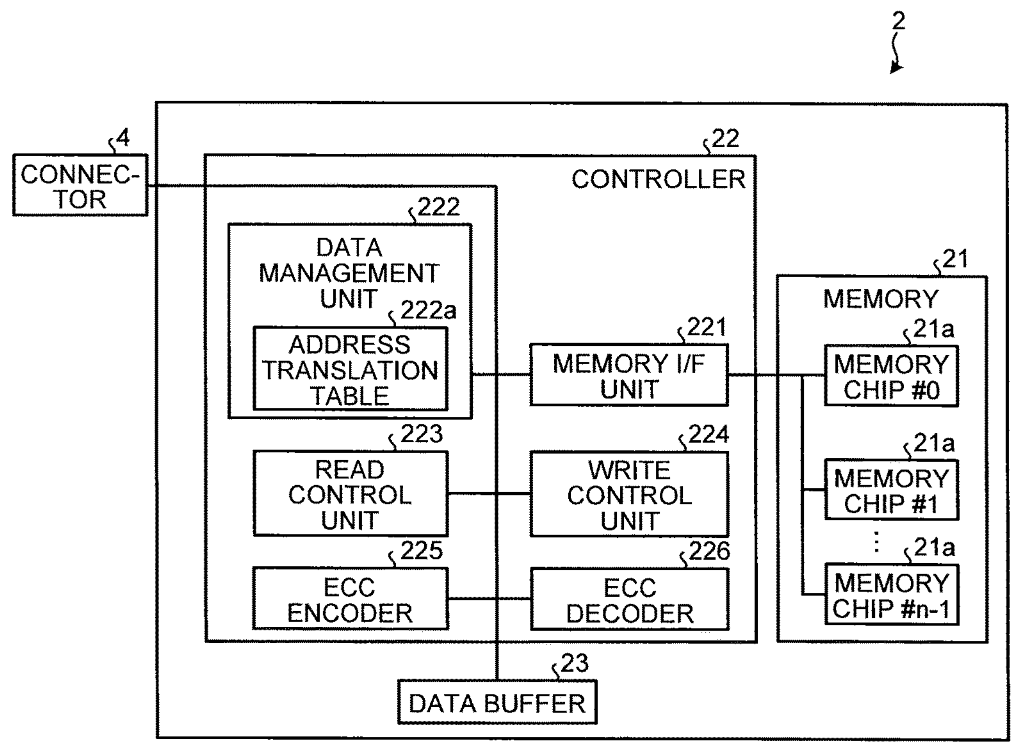
FIG. 6 is an exemplary and schematic block diagram showing a controller included in the semiconductor device according to the embodiment.

As exemplified in FIGS. 5 and 6, each memory element 2 (element) includes a memory 21, a controller 22, and a data buffer 23. Further, as shown in FIG. 5, the memory element 2 includes a board 24 and a cover 25. The memory element 2 is formed as one package SSD (package) including the memory 21 and the controller 22. Further, the memory element 2 may be formed as a BGA (ball grid array) or CSP (chip size package).

For example, the board 24 shown in FIG. 5 may be formed as a rigid printed wiring board, such as a multilayer board, build-up board, or coreless board. The board 24 includes insulating portions and conductive portions. The insulating portions may be made of a synthetic resin material or ceramic, which has an insulating property. Further, the conductive portions include conductive patterns (wiring patterns), conductive layers, vias, and/or penetration electrodes. The board 24 is formed in a quadrilateral shape and in a plate state. The board 24 may also be referred to as an interposer, substrate, or package board.

The board 24 includes a face 24*a* on which components, such as the memory 21 and the controller 22, are mounted and a face 24*b* opposite to the face 24*a*. The face 24*a* may also be referred to as a component mounting face. For example, components, such as the memory 21 and the controller 22, are fixed to the face 24*a* through a mounting film (not shown). Further, for example, a plurality of memory chips 21*a* included in the memory 21 are fixed to each other through a mounting film in a laminated state. Conductive portions (not shown) of the memory chips 21*a* (memory 21) and the controller 22 are electrically connected to conductive portions of the board 24 through wires 26.

The cover 25 covers the face 24*a* along with components, such as the memory 21 and the controller 22, mounted thereon. The cover 25 may be made of a synthetic resin material having an insulating property. The cover 25 is also referred to as a sealing material, and it serves to protect and/or insulate the components.

The face 24*b* of the board 24 is equipped with a plurality of connecting portions 27. The connecting portions 27 electrically and mechanically connect conductive portions (not shown) of the memory element 2 and conductive portions (not shown) of the circuit board 3. The terminals 4*a* of the connector 4 provided on the circuit board 3 are electrically connected to the controller 22 through conductive portions (not shown) inside the circuit board 3, the connecting portions 27, conductive portions (not shown) inside the board 24, and wires 26. For example, the connecting portions 27 are formed of solder balls, and they may also be referred to as bumps or joint portions.

The memory 21 is a nonvolatile memory, such as a NAND type flash memory. The memory 21 is not limited to a NAND type flash memory, but may be an RERAM (resistance random access memory) or an FERAM (ferroelectric random access memory). Further, the memory 21 stores user data transmitted from the device (host device) outside the semiconductor device 1 and system data used only inside the memory element 2. Further, the memory 21 includes a memory cell array including a plurality of memory cells (not shown) arrayed in a matrix format. Each of the memory cells can store binary or multi-value data. Further, the memory 21 includes a plurality of (n-number of) memory chips 21*a* (#0 to #n−1).

The data buffer 23 is configured to temporarily hold data. For example, the data buffer 23 is a DRAM (dynamic static random access memory). The data buffer 23 is not limited to a DRAM, but may be an SRAM (static random access memory) or the like. The data buffer 23 may be provided independently of the controller 22 or may be mounted inside the chip of the controller 22 as a built-in type memory.

The controller 22 is configured to control the memory element 2. For example, the functions of the controller 22 can be realized by a processor for executing firmware stored in the memory 21 or an ROM (read only memory) included in the controller 22, and/or hardware. The controller 22 can read data from the memory 21 and write data into the memory 21, in accordance with commands from the host device.

Further, the controller 22 includes a memory interface unit 221, a data management unit 222, a read control unit 223, a write control unit 224, an ECC encoder 225, and an ECC decoder 226.

The memory interface unit 221 is a controller for controlling the memory 21. The memory interface unit 221 writes a code word, which has been input from the ECC encoder 225, into the memory 21 under the control of the write control unit 224 and so forth. Further, the memory interface unit 221 reads a code word from the memory 21 and transfers it to the ECC decoder 226 under the control of the read control unit 223 and so forth.

The data management unit 222 performs management about positions on the memory 21 to which data is stored. The data management unit 222 includes an address translation table 222*a* that correlates logical addresses given by the host device with physical positions on the memory 21, and performs garbage collection in accordance with the use situation of the blocks on the memory.

The read control unit 223 executes a process for reading data from the memory 21 in accordance with a command notified by the host device through the connector 4. Specifically, the read control unit 223 obtains a physical position on the memory 21, which corresponds to the logical address of read data, from the data management unit 222, and notifies this physical position to the memory interface unit 221. The data thus read is transmitted to the host device through the ECC encoder 225 and the data buffer 23.

The write control unit 224 executes a process for writing data into the memory 21 in accordance with a command notified by the host device through the connector 4. Specifically, the write control unit 224 obtains a physical position on the memory 21, into which data is to be written, from the data management unit 222, and outputs this physical position and a code word, which has been output from the ECC encoder 225, to the memory interface unit 221.

The ECC encoder 225 encodes data stored in the data buffer 23, and generates a code word containing the data and a redundant part (parity). The ECC decoder 226 obtains a code word, which has been read from the memory 21, from the memory interface unit 221, and decodes the code word thus obtained. When the ECC decoder 226 fails in error correction during the decoding, it notifies a read error to the read control unit 223.

Figure 7:
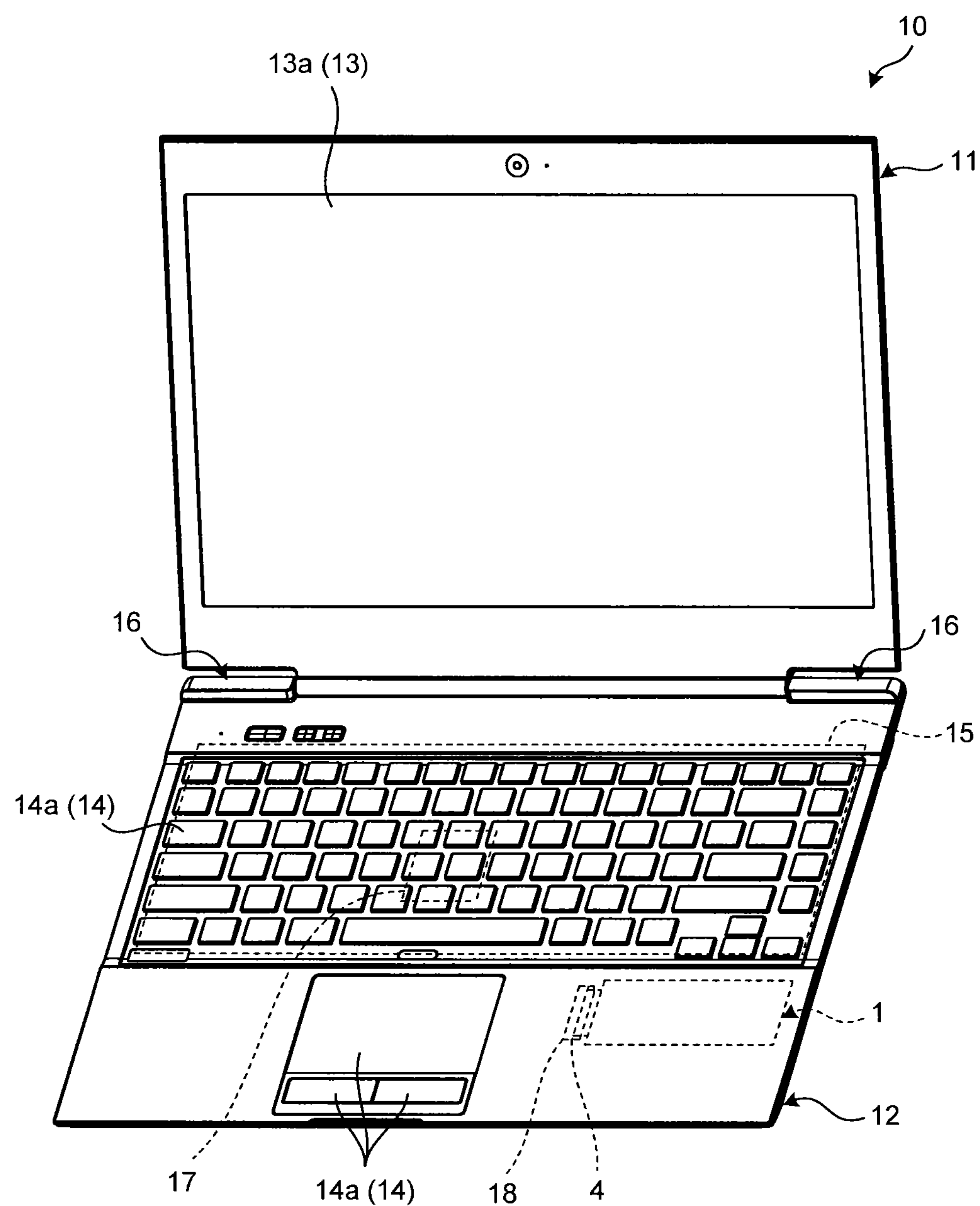
FIG. 7 is an exemplary and schematic perspective view showing an electronic device, to which the semiconductor device according to the embodiment is electrically connected.

As exemplified in FIG. 7, the semiconductor device 1 may be used in a state contained in an electronic device 10, such as a personal computer. The electronic device 10 includes casings 11 and 12, a display 13, and an input device 14. The casing 11 is connected to the casing 12 to be rotatable by a hinge portion 16. The display 13 is built in the casing 11 in a state where a display face 13*a* is exposed, and the input device 14 is built in the casing 12 in a state where an input portion 14*a* is exposed. The display 13 is formed of an LCD or OELD, for example. The input device 14 is formed of a keyboard, pointing device, and/or click button, for example. Further, in the casing 12, there is contained the semiconductor device 1 and a circuit board 15, on which a CPU 17 (central processing unit) and electronic components (not shown), such as a controller, are mounted. The circuit board 15 and the semiconductor device 1 are electrically connected to each other through wiring lines of, e.g., a flexible printed wiring board, a connector 18 provided in the electronic device 10, and the connector 4 connected to the connector 18. The connectors 4 and 18 transmit signals between the electronic device 10 and the semiconductor device 1. The electronic device 10 is an example of the host device, and the CPU 17 is an example of a host control unit. The connector 18 is an example of a second connector. The host control unit may be a member other than the CPU 17. Further, the electronic device is not limited to a personal computer of a clamshell type, but may be another electronic device, such as a tablet or server.

The electronic device 10 may include a RAID (redundant array of independent disks) controller for controlling the semiconductor device 1. The RAID controller may be formed of a software RAID that is operated by a CPU or the like based on software, such as an OS (operating system), or a hardware RAID that is operated by a controller other than a CPU or the like. In this case, the electronic device 10 (RAID controller 100) is configured to control a plurality of memory elements 2 as storage devices individually from each other.

Figure 8:
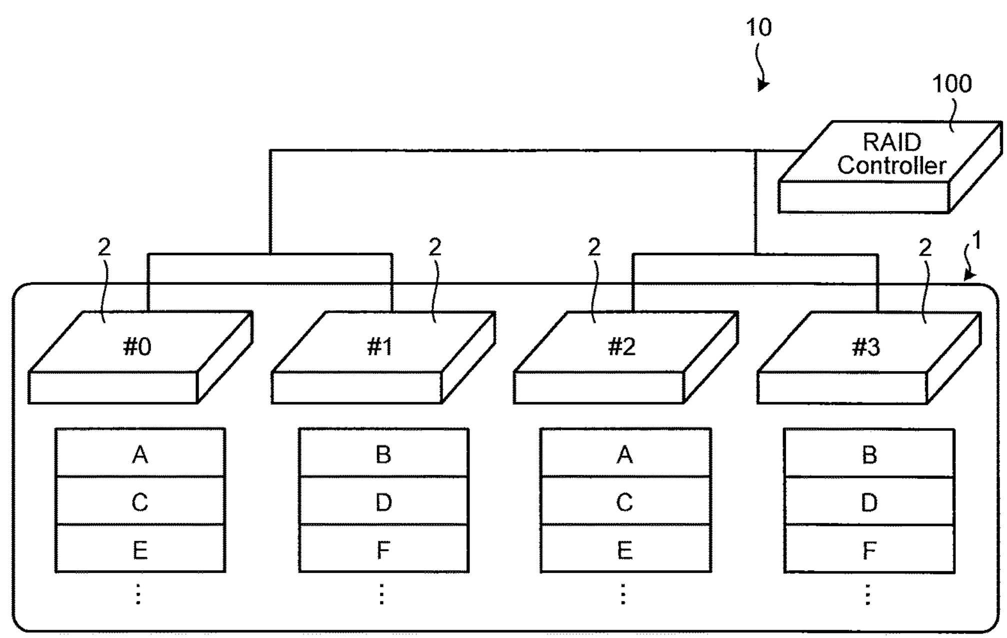
FIG. 8 is an exemplary and schematic block diagram showing a case where the semiconductor device according to the embodiment is used as a memory device of RAID0+1 by a RAID controller of the electronic device.

As shown in FIG. 8, the RAID controller 100 of the electronic device 10 can use the semiconductor device 1 as a memory device of RAID0+1, for example. In the example shown in FIG. 8, the RAID controller 100 arranges a striping set (RAID0) of memory elements 2 of #0 and #1 and a striping set (RAID0) of memory elements 2 of #2 and #3, to form a mirror configuration (RAID1). The RAID controller 100 is an example of the host control unit.

Figure 9:
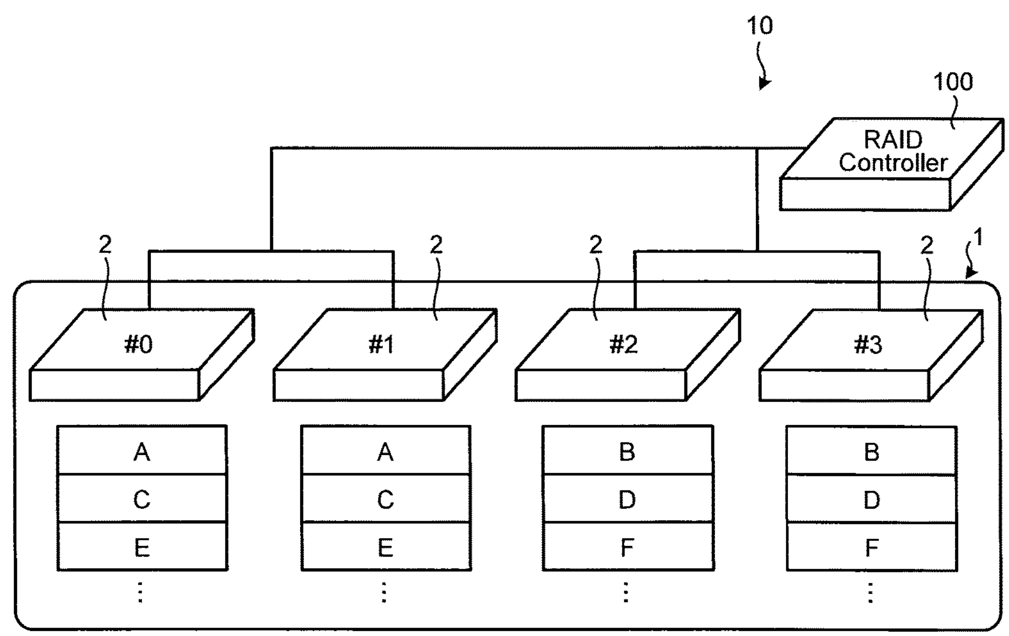
FIG. 9 is an exemplary and schematic block diagram showing a case where the semiconductor device according to the embodiment is used as a memory device of RAID1+0 by the RAID controller of the electronic device.

Further, as shown in FIG. 9, the RAID controller 100 of the electronic device 10 can use the semiconductor device 1 as a memory device of RAID1+0, for example. In the example shown in FIG. 9, the RAID controller 100 arranges a mirror set (RAID1) of memory elements 2 of #0 and #1 and a mirror set (RAID1) of memory elements 2 of #2 and #3, to form a striping configuration (RAID0). In this case, data can be held until both of the two memory elements 2 forming the same mirror set break down. For example, even in a case where the memory element 2 of #0 breaks down and then the memory element 2 of #3 or #4 breaks down, the semiconductor device 1 can continue its operation.

Figure 10:
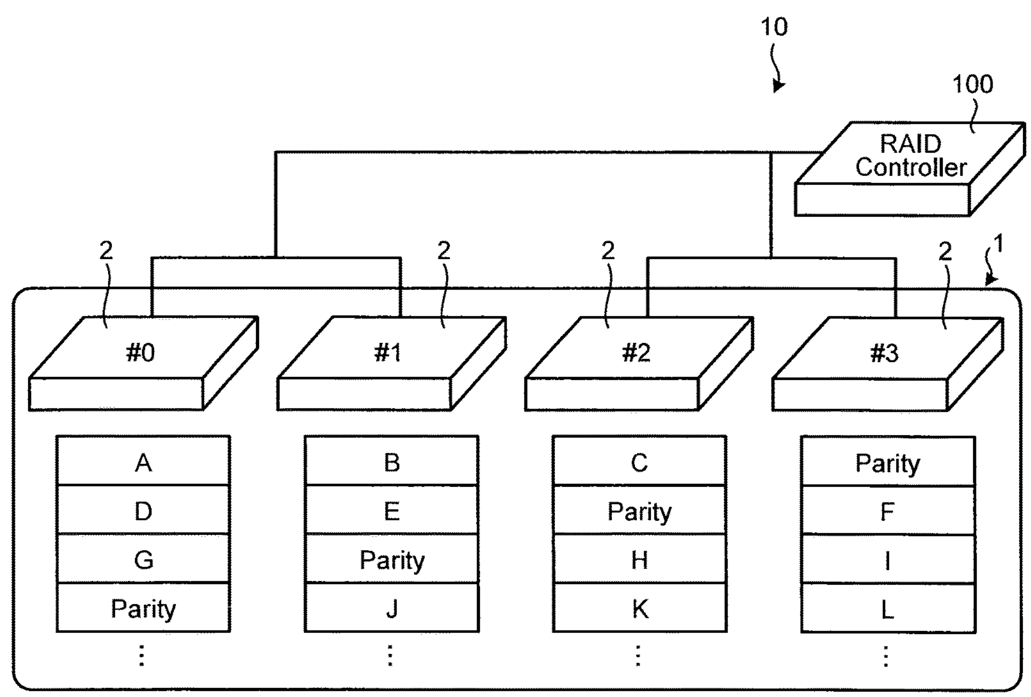
FIG. 10 is an exemplary and schematic block diagram showing a case where the semiconductor device according to the embodiment is used as a memory device of RAID5 by the RAID controller of the electronic device.

Further, as shown in FIG. 10, the RAID controller 100 of the electronic device 10 can use the semiconductor device 1 as a memory device of RAID5, for example. In the example shown in FIG. 10, the RAID controller 100 generates parity data for correcting errors, for every combination of three data blocks, and records them in a distributed state. In this case, even if one memory element 2 breaks down, the lost data can be restored by use of data and parity stored in a remaining memory element 2. Here, a method of storing data into the semiconductor device 1 by the electronic device 10 is not limited to the examples shown in FIGS. 8 to 10, and so another RAID or another method may be used to store data into the semiconductor device 1.

As has been described above, the semiconductor device 1 according to this embodiment includes a plurality of controllers 22, and further includes the buses 5*a* to 5*c* (first signal lines) used in common by the plurality of controllers 22 and configured to transmit control signals. Accordingly, in this embodiment, for example, it is possible to perform read and write of data at a higher speed by use of the plurality of controllers 22. Further, since the semiconductor device 1 includes the buses 5*a* to 5*c* used in common by the plurality of controllers 22, the arrangement of the terminals 4*a* of the connectors 4 and 18 can be made common to semiconductor devices of a plurality of types that differs in configuration concerning the number and/or connection of the controllers 22 and the memory elements 2. Accordingly, for example, it is possible to easily reduce the labor and cost necessary for developing and manufacturing the semiconductor device 1 and/or the electronic device 10. Further, for example, there is also obtained such a merit that semiconductor devices of different configurations (types) can be exchanged and used for the electronic device 10.

Further, in this embodiment, each of the memory elements 2 is formed of a package containing the memory 21 and the controller 22. Accordingly, it is possible to easily reduce the labor and cost necessary for manufacture, as compared with, for example, a case where the memory 21 and the controller 22 are individually provided on the circuit board 3.

Further, in this embodiment, the connector 4 (first connector) includes the terminals 41*a* (first terminals), the terminals 42*a* (second terminals), and the terminals 43*a* (third terminals). Accordingly, it is possible to reduce the labor and cost necessary for manufacturing, assembling, and/or exchanging the semiconductor device 1, as compared with, for example, a case where these terminals 41*a*, 42*a*, and 43*a* are respectively provided on different connectors. Here, the single connector 4 includes a plurality of terminals 4*a* that change the electric connection states (connection and cutoff) in the attaching/detaching operation of this connector 4.

Further, in this embodiment, each of the terminals 43*a* (third terminals) is set to have electric statuses. In this case, by detecting the electric statuses of the terminals 43*a*, the CPU 17 (host control unit) of the electronic device 10 (host device) can transmit signals between the CPU 17 and the plurality of controllers 22 through the terminals 41*a* (first terminals) and the buses 5*a* to 5*c* (first signal lines), which are made common to the plurality of controllers 22, to control read of data from the memories 21 and write of data into the memories 21. Accordingly, in accordance with the detection results about the terminals 43*a*, for example, the electronic device 10 can easily or effectively utilize the memories 21 of the semiconductor device 1. Further, by considering the electric statuses of the terminals 43*a* as impedance or potential statuses, for example, there is provided such effects that the electric statuses can be more easily set in the semiconductor device 1 and that the electric statuses can be more easily detected by the electronic device 10. Further, by utilizing idle terminals of a connector of the conventional PCI Express standard as the terminals 43*a*, alteration from the conventional standard can be made smaller. In this case, the type (a) having the same configuration as the conventional one can be used as in the semiconductor device according to the embodiment described above, by allocating an electric status in the conventional way, i.e., allocating "NC" for an idle terminal, even when this conventional semiconductor device is attached.

While a certain embodiment of the present invention has been described, this embodiment has been presented by way of example only, and is not intended to limit the scope of the invention. The embodiment described herein may be embodied in a variety of other forms, and may be embodied along with various omissions, substitutions, combinations, and changes, without departing from the spirit of the invention. The accompanying claims and their equivalents are intended to cover such embodied forms as would fall within the scope and spirit of the invention. Further, the configurations and shapes of embodied forms and modifications may be implemented by partly exchanging them. Further, the specifications of the configurations and shapes (structure, type, direction, shape, size, length, width, thickness, height, number, arrangement, position, material, and so forth) may be implemented along with suitable changes. For example, the semiconductor device may be formed as a storage device of a so-called external type contained in a casing. Further, the controller may be provided independently of an element including the memory. Further, in the embodiment described above, the semiconductor device 1 is exemplified as being of the type (d) shown in FIG. 4, but a semiconductor device of another type (b) or (c) having a plurality of controllers shown in FIG. 4 may have the same technical features as those of the embodiment described above.

Figure 11:
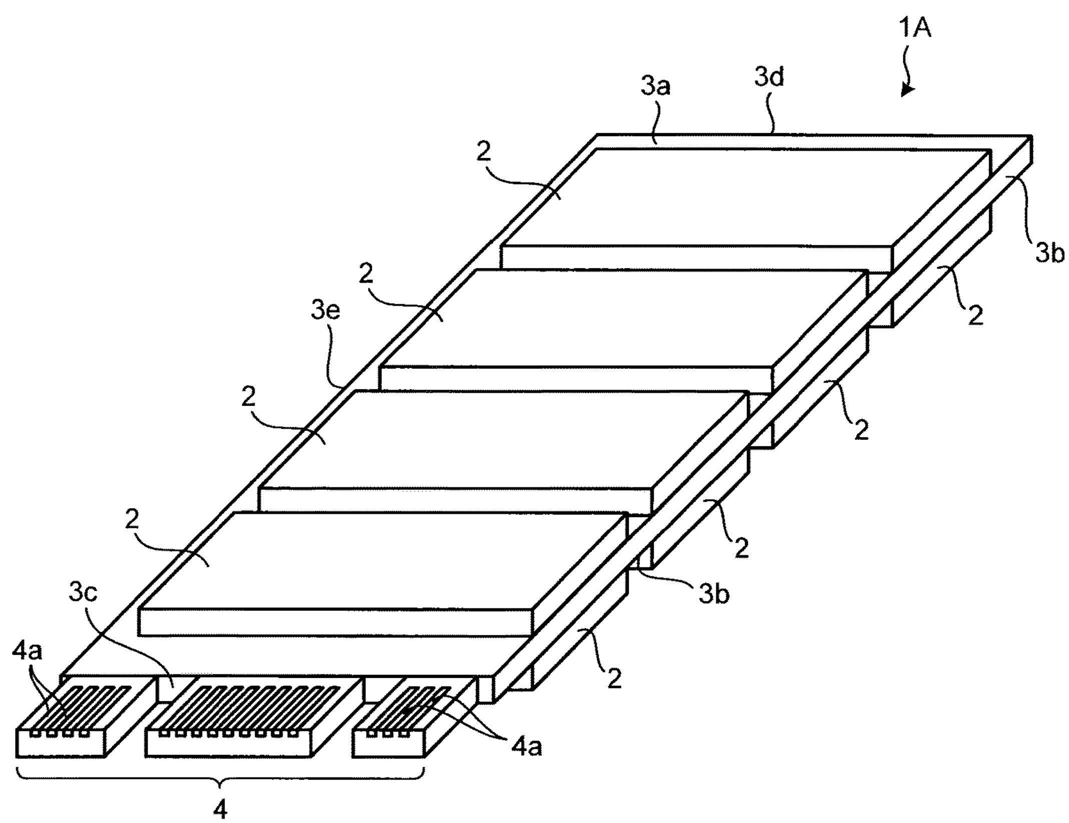
FIG. 11 is an exemplary and schematic perspective view showing a semiconductor device according to a modification of the embodiment.

Further, for example, FIG. 11 shows a semiconductor device 1A as an example according to a modification of the embodiment, in which four, i.e., a plurality of, memory elements 2 are provided on a face 3*a* (first face) of a circuit board 3, and four, i.e., a plurality of, memory elements 2 are provided on a face 3*b* (second face) of the circuit board 3. Each of the memory elements 2 contains the memory 21 and the controller 22. This modification can provide the same effects as those of the semiconductor device 1 according to the embodiment. Here, in this case, since the number of memory elements 2, i.e., the number of controllers 22, is larger, the number of terminals 43*a* may be increased in accordance with the set number for the configuration type. The number of memory elements 2 may differ between the face 3*a* and the face 3*b*.

What is claimed is:

1. A semiconductor device comprising:

a circuit board;

a first package provided on the circuit board, the first package including a first memory and a first controller configured to control the first memory;

a second package provided on the circuit board, the second package including a second memory and a second controller configured to control the second memory;

an interface unit configured to be connectable to a host device, the interface unit including a first terminal; and a first signal line through which a control signal is transmitted, the first signal line electrically connecting the first terminal to the first controller and connecting the first terminal to the second controller, wherein, the first signal line is connected to the first controller and the second controller, and is used in common by the first controller and the second controller, the control signal being transmitted to the first controller and the second controller from the host device via the first terminal and the first signal line.

2. The semiconductor device according to claim 1, wherein the first controller is configured to control read of data from the first memory and to control write of data into the first memory, and the second controller is configured to control read of data from the second memory and to control write of data into the second memory.

3. The semiconductor device according to claim 1, wherein the interface unit includes a second terminal electrically connected to a second signal line, the second signal line being connected to the first controller or the second controller, the second signal line being a line through which a data signal is transmitted.

4. The semiconductor device according to claim 3, wherein the interface unit includes a third terminal, and an electric status corresponding to a configuration of the semiconductor device is set in the third terminal.

5. The semiconductor device according to claim 4, wherein the electric status is an impedance status.

6. The semiconductor device according to claim 4, wherein the electric status is a potential status.

7. The semiconductor device according to claim 6, wherein the third terminal is set at a ground potential of the semiconductor device, or set at a potential different from the ground potential and a power supply potential of the semiconductor device.

8. The semiconductor device according to claim 1, wherein the circuit board includes a first face, and the first package and the second package are provided on the first face.

9. The semiconductor device according to claim 1, wherein the circuit board includes a first face and a second face, the second face being on a side opposite to the first face, and the first package is provided on the first face, and the second package is provided on the second face.

10. An electronic device comprising:

a host device; and a semiconductor device, the semiconductor device including a circuit board, a first package, a second package, an interface unit and a first signal line, the first package being provided on the circuit board, the first package including a first memory and a first controller configured to control the first memory, the second package including a second memory and a second controller configured to control the second memory, the interface unit being configured to be connectable to the host device, the interface unit including a first terminal, the first signal line being a line through which a control signal is transmitted, the first signal line electrically connecting the first terminal to the first controller and connecting the first terminal to the second controller, the first signal line being connected to the first controller and the second controller, the first signal line being used in common by the first controller and the second controller, the control signal being transmitted to the first controller and the second controller from the host device via the first terminal and the first signal line.

11. The electronic device according to claim 10, wherein the interface unit conforms to PCI Express standard.

12. The electronic device according to claim 10, wherein the interface unit includes a second terminal electrically connected to a second signal line, the second signal line being connected to the first controller or the second controller, the second signal line being a line through which a data signal is transmitted.

13. The electronic device according to claim 12, wherein the interface unit includes a third terminal, and an electric status corresponding to a configuration of the semiconductor device is set in the third terminal.

14. The electronic device according to claim 13, wherein the host device is configured to detect the electric status set in the third terminal, and discriminate the configuration of the semiconductor device based on the detected electric status.

15. The electronic device according to claim 14, wherein the host device is configured to construct a RAID using the first package and the second package based on the detected electric status.

16. The electronic device according to claim 15, wherein the electric status is an impedance status.

17. The electronic device according to claim 15, wherein the electric status is a potential status.

18. The electronic device according to claim 17, wherein the third terminal is set at a ground potential of the semiconductor device, or set at a potential different from the ground potential and a power supply potential of the semiconductor device.

19. The electronic device according to claim 10, wherein the circuit board includes a first face, and the first package and the second package are provided on the first face.

20. The electronic device according to claim 10, wherein the circuit board includes a first face and a second face, the second face being on a side opposite to the first face, and the first package is provided on the first face, and the second package is provided on the second face.

* * * * *